(12) United States Patent
Bogue et al.

(10) Patent No.: US 12,395,084 B2
(45) Date of Patent: *Aug. 19, 2025

(54) VOLTAGE REGULATOR WITH HIGH AND LOW POWER MODES

(71) Applicant: Ambiq Micro, Inc., Austin, TX (US)

(72) Inventors: Ivan Bogue, Austin, TX (US); Yousof Mortazavi, Austin, TX (US)

(73) Assignee: AMBIQ MICRO, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/121,593

(22) Filed: Dec. 14, 2020

(65) Prior Publication Data

US 2021/0104948 A1  Apr. 8, 2021

Related U.S. Application Data

(63) Continuation of application No. 16/375,391, filed on Apr. 4, 2019, now Pat. No. 10,897,203.

(51) Int. Cl.
*H02M 3/158* (2006.01)
*H02M 1/00* (2007.01)
*H03K 17/0814* (2006.01)

(52) U.S. Cl.
CPC ....... *H02M 3/1588* (2013.01); *H02M 1/0025* (2021.05); *H03K 17/08142* (2013.01); *H02M 1/0009* (2021.05)

(58) Field of Classification Search
CPC .... H02M 3/155; H02M 3/156; H02M 3/1563; H02M 3/158; H02M 3/1584; H02M 3/1588; H02M 2003/1586; H02M 2001/0009; H02M 2001/0025; H02M 2001/0045; H02M 1/32; H02M 1/0025; H02M 3/1566; G05F 3/02; G05F 1/46–618

See application file for complete search history.

(56) References Cited

U.S. PATENT DOCUMENTS

| | | | |
|---|---|---|---|
| 5,481,178 A | 1/1996 | Wilcox et al. | |
| 8,970,199 B2* | 3/2015 | Scoones | H02M 3/157 323/285 |
| 9,804,617 B2* | 10/2017 | Turkewadikar | G05F 1/56 |
| 10,534,387 B2* | 1/2020 | Turkewadikar | G01R 33/0023 |
| 2007/0114986 A1* | 5/2007 | Yoshii | H02M 3/1588 323/288 |
| 2009/0309559 A1* | 12/2009 | Xia | H02M 3/1588 323/265 |

(Continued)

*Primary Examiner* — Gustavo A Rosario-Benitez
(74) *Attorney, Agent, or Firm* — David R. Stevens; Stevens Law Group

(57) ABSTRACT

A buck converter may operate in a low power mode or a high power mode based on a power requirements of a load. In the high power mode, modifications to increase frequency response include a higher polling frequency for a comparator, a lower impedance divider in a feedback circuit, a higher biasing current for a comparator, and larger switches for providing current to a reactive step-down circuit of the buck converter. In the low power mode these modifications are reversed. The buck converter may make use of an improved strong arm comparator and a circuit for sensing presence of an inductor in the reactive step-down circuit.

6 Claims, 13 Drawing Sheets

(56) References Cited

U.S. PATENT DOCUMENTS

| | | | |
|---|---|---|---|
| 2011/0194314 A1* | 8/2011 | Morota | H02M 3/33507 |
| | | | 363/21.15 |
| 2012/0032660 A1* | 2/2012 | Nakamura | H02M 3/156 |
| | | | 323/288 |
| 2012/0161732 A1* | 6/2012 | Renton | H02M 3/156 |
| | | | 323/275 |
| 2015/0137778 A1* | 5/2015 | Miyazaki | H02M 3/156 |
| | | | 323/271 |
| 2016/0172973 A1* | 6/2016 | Rince | H02M 3/158 |
| | | | 323/271 |
| 2016/0190926 A1* | 6/2016 | Ni | H02M 3/158 |
| | | | 323/271 |
| 2017/0070145 A1* | 3/2017 | Childs | H02M 3/158 |
| 2017/0077912 A1* | 3/2017 | Fu | H02M 3/158 |
| 2017/0147020 A1* | 5/2017 | Turkewadikar | G05F 1/56 |
| 2017/0160756 A1* | 6/2017 | Hsieh | H02M 3/155 |
| 2017/0187286 A1* | 6/2017 | Kunz | H02M 3/158 |
| 2019/0252969 A1* | 8/2019 | Li | H02M 3/158 |
| 2022/0216797 A1* | 7/2022 | Endo | H02M 1/4225 |

* cited by examiner

VOLTAGE REGULATOR WITH HIGH AND LOW POWER MODES

RELATED APPLICATIONS

This application is a continuation of U.S. application Ser. No. 16/375,391 entitled "Buck Converter With Inductor Sensor" and filed Apr. 4, 2019, which is hereby incorporated herein by reference in its entirety

BACKGROUND

Field of the Invention

This invention relates to buck converters for providing a step down in voltage in electronic circuits.

Background of the Invention

In battery powered systems it is often necessary to lower the battery voltage to a specific voltage. One efficient way to lower the voltage is by using a buck converter. Buck converters function by charging a capacitor through an inductor. This is typically done at fixed frequency.

It would be an advancement in the art to provide a buck converter that reduced power consumption in order to extend battery life.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

Buck converters operate in a variety of conditions. In particular, the amount of power required by a load is highly variable. For example, when a load is powered on but in sleep mode, the amount of power required is much lower than when the load is active.

A conventional buck converter would operate at the same frequency regardless of load. However, if the output of the buck converter only needs to provide a small current, it is not efficient to use a fast frequency. The design of a buck converter outlined below provides a more power efficient circuit.

Typically large NMOS (n-type metal oxide semiconductor) and PMOS (p-type metal oxide semiconductor) devices are used to apply the current to the inductor in a buck converter. If these devices are too small, functionality will be sub-optimal and their resistance will create extra power consumption when a high output current is needed (large conduction loss). If they are too large, the gate capacitance associated with these devices will be large, and also create extra power consumption (larger switching loss). The variable sized switches described herein enable adaptation to the amount of current required for a given loading.

Inductors are components that are difficult to integrate in integrated circuits. In most cases, the inductance value desired is large enough that the size of the inductor would be prohibitively large. However, adding an external inductor is not always desirable. An inductor adds to the cost and complexity of the system. Also disclosed herein is a voltage converter that can function as a buck converter with an inductor or as a LDO (low drop out) converter without an inductor.

By combining the advantages of frequency adjustment, inductor switch dynamic sizing, comparator dynamic sizing, and possibly inductor sensing, one can improve the power characteristics of a buck converter significantly. The details of the implementation of each of these improvements is described in detail below.

Figure 1:
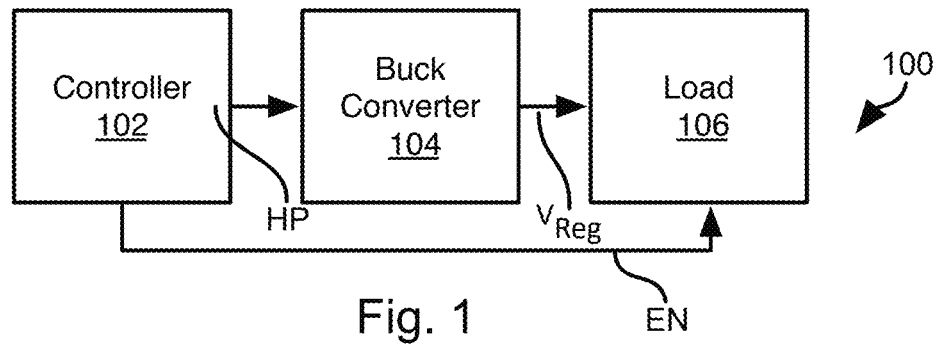
FIG. 1 is a schematic block diagram of components implementing a system incorporating a buck converter in accordance with an embodiment of the present invention.

Referring to FIG. 1, a system 100 may include a controller 102, such as a general purpose processor or other processing device programmed to control or access the functionality of another component. The controller 102 may control operation of a buck converter 104 that supplies power to one or more loads 106. The controller 102 may be coupled by an EN (enable) line to an enable input of the load 106 such that the load 106 is in active mode only when a signal is asserted on the EN line. Otherwise, the load 106 may remain in a sleep mode or otherwise be inactive. Examples of loads include an ADC (analog to digital converter), PDM (pulse density modulator), or any other load).

The controller 102 may be coupled to the buck converter by a HP (high power mode) line. When a signal is asserted on the HP line (e.g., a high voltage or binary 1), the buck converter 104 may operate in a high power mode as discussed below. When the HP line is not asserted, the buck converter 104 may operate in a low power mode as also discussed below. In other embodiments, a separate line, e.g. a LP (low power) line may couple the controller 102 to the buck converter 104 such that the buck converter 104 operates in the low power mode when the LP line is asserted.

In some embodiments, the buck converter 104 operates in the high power mode whenever the load is enabled. Accordingly, the EN input of the load 106 and the HP input of the buck converter 104 may be coupled to the same signal line. For example, only an EN or only an HP output is provided by the controller 102 that both places the buck converter 104 in high power mode and enables the load 106.

The buck converter 104 includes or drives a reactive (e.g. including one or both of a capacitor and an inductor) circuit for stepping down a voltage from a source, such as a battery (not shown) to a lower voltage required by the load 106.

Figure 2:
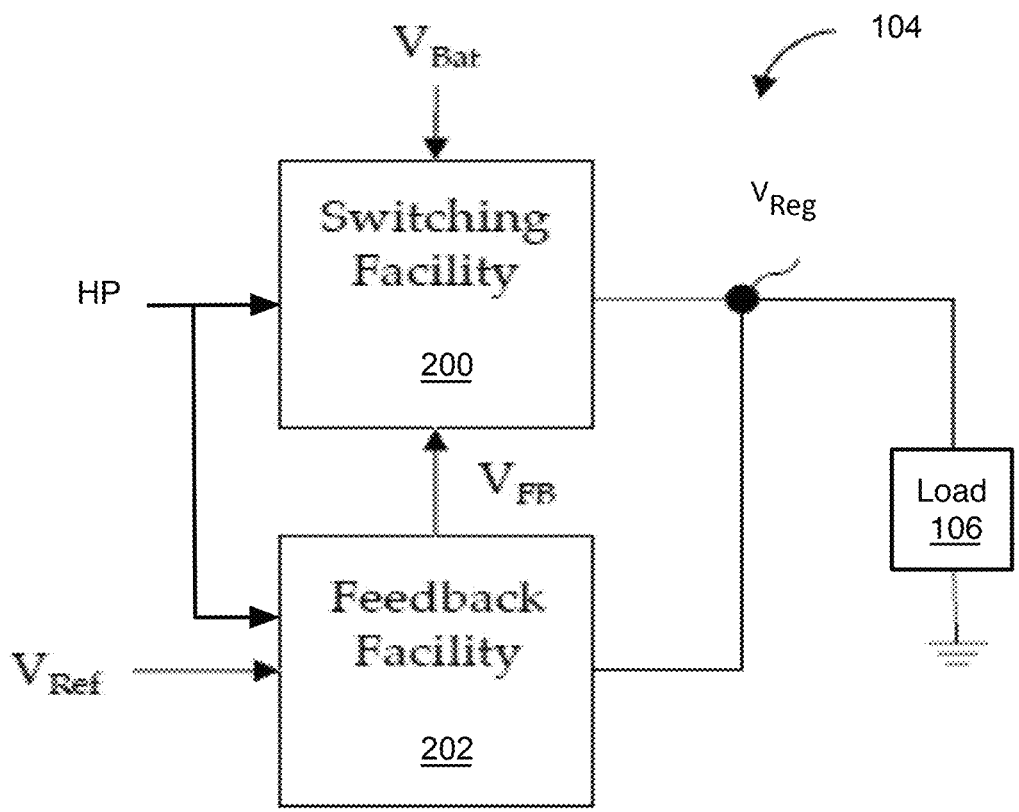
FIG. 2 is a schematic block diagram of a load coupled to a buck converter in accordance with an embodiment of the present invention.

Referring to FIG. 2, the buck converter 104 may include a switching facility 200 and a feedback facility 202. One or both of the switching facility 200 and the feedback facility 202 may have a high power mode and a low power mode. Accordingly, both may be coupled to the HP line. The switching facility 200 may further take as an input $V_{Bat}$, which is coupled to a power source, such as a battery. The switching facility 200 includes an output at voltage/node $V_{Reg}$, which is a stepped down voltage from $V_{Bat}$.

The feedback facility 202 takes as an input a reference voltage $V_{Ref}$ and has an input coupled to $V_{Reg}$. The feedback facility includes an output $V_{FB}$ (feedback voltage) that is based on a comparison of $V_{Ref}$ to a function of $V_{Reg}$ or a function of $V_{Reg}$ to a function of $V_{Ref}$. The switching facility 200 will then switch on power to the $V_{Reg}$ node when indicated by $V_{FB}$. As discussed in detail below, the frequency at which the switching facility evaluates $V_{FB}$ and potentially connects $V_{Reg}$ to $V_{Bat}$ is a function of the signal on the HP line. When a signal (e.g., a binary 1 voltage) is asserted on the HP line, the polling frequency of the comparator within the switching facility is increased relative to when the signal is not asserted. For purpose of this disclose "high voltage" or "binary 1" shall be understood to refer to a voltage sufficiently high to turn on a high threshold transistor for the implementing process, e.g. an NMOS transistor in the CMOS technology used to implement the buck converter 104. A "low voltage" or "binary 0" shall be understood to be sufficiently low to turn on a low threshold transistor for the implementing process, e.g. a PMOS transistor in the CMOS technology used to implement the buck converter 104.

In some embodiments, a biasing current driving a comparator in one or both of the switching facility 200 and the feedback facility 202 is reduced when the signal is not asserted on the HP line relative to the biasing current when the signal is asserted. In some embodiments, the impedance of a voltage divider that steps down $V_{Reg}$ is also increased when the signal is not asserted on the HP line relative to the impedance of the voltage divider when the signal is asserted.

Figure 3:
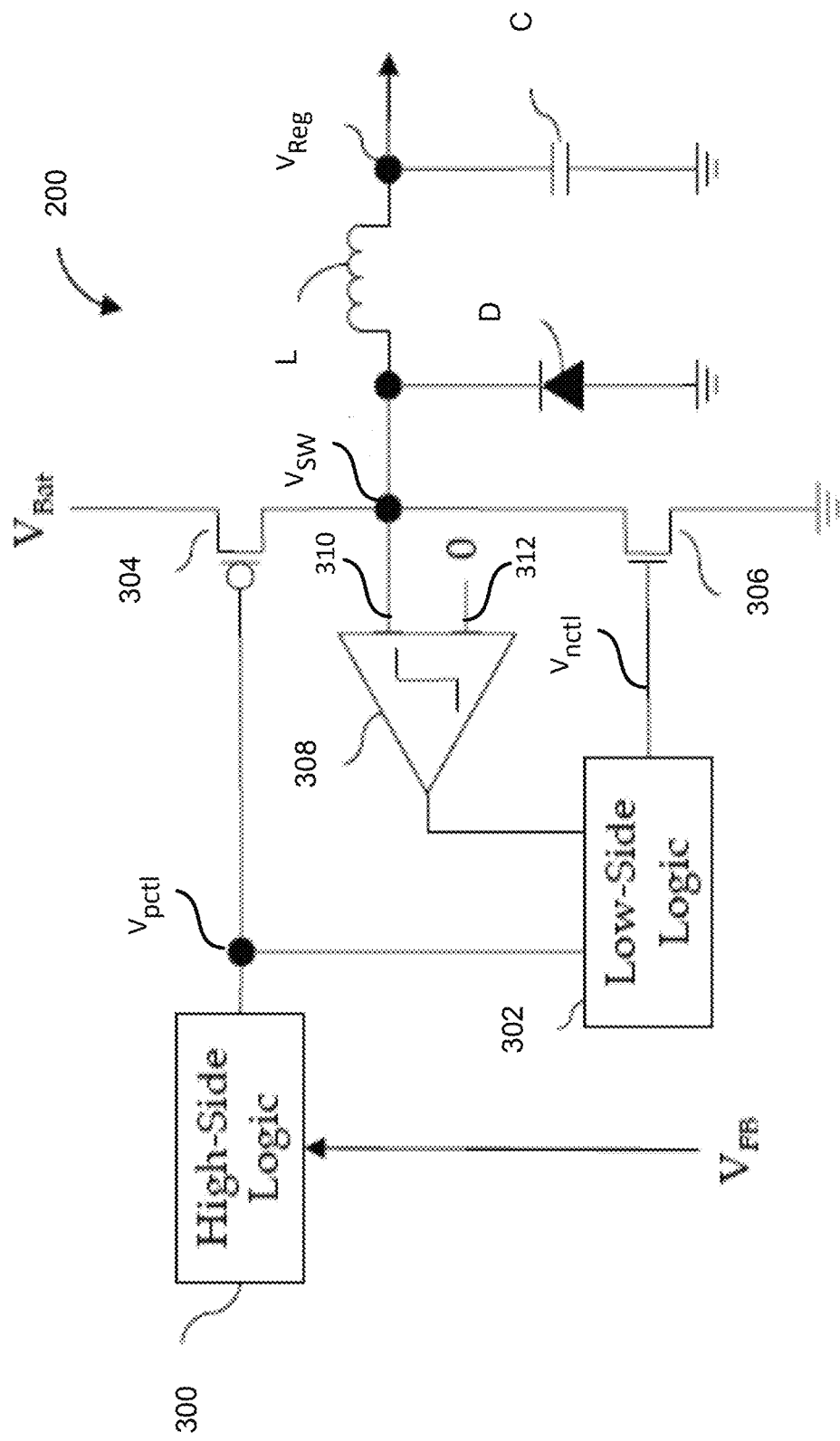
FIG. 3 is a schematic block diagram of a switching facility of a buck converter in accordance with an embodiment of the present invention.
Figure 4:
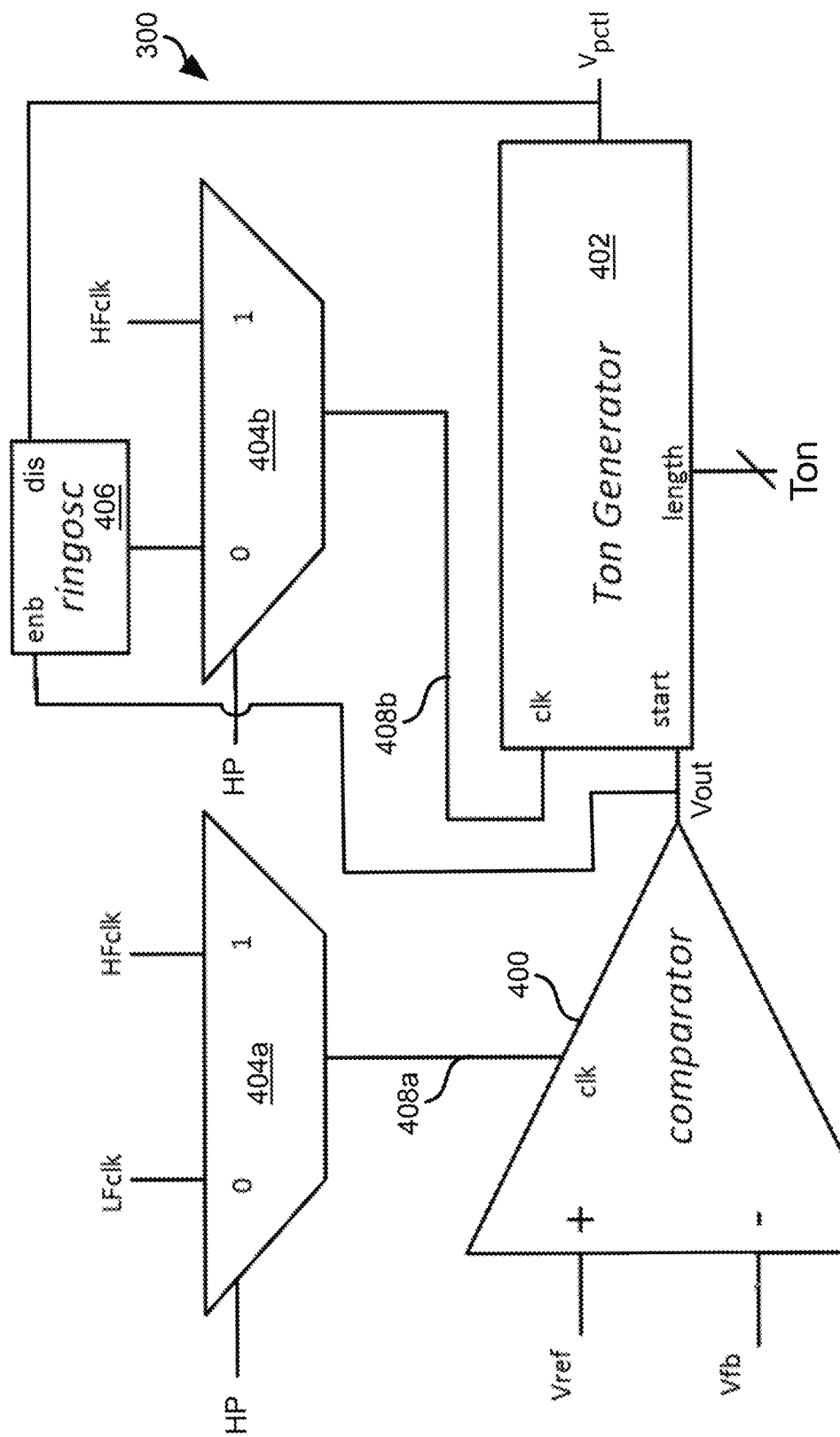
FIG. 4 is a schematic block diagram of high side logic of the switching facility in accordance with an embodiment of the present invention.
Figure 5:
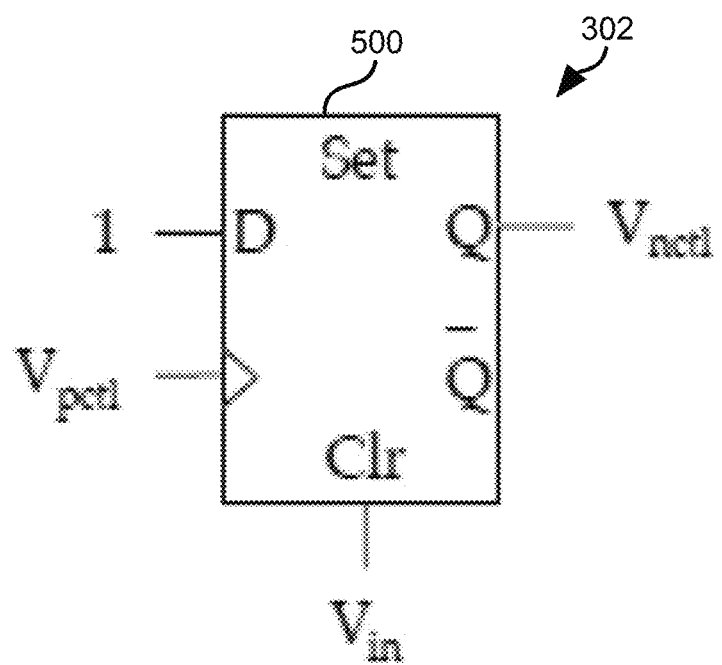
FIG. 5 is a schematic block diagram of low side logic of the switching facility in accordance with an embodiment of the present invention.

FIG. 3 is a schematic block diagram of an example embodiment of the switching facility 200. High side logic 300 takes as an input $V_{FB}$ and outputs a signal to node/voltage $V_{pctl}$. Low side logic 302 has an input coupled to $V_{pctl}$ and provides an output to node/voltage $V_{nctl}$. An example implementation of the high side logic is shown in FIG. 4. An example implementation of the low side logic is shown in FIG. 5.

FIG. 3 further shows an example reactive step-down circuit including an inductor L, a capacitor C, and a diode D having the illustrated configuration which is common to most buck converters known in the art. As is apparent one end of the inductor L is coupled to node/voltage $V_{SW}$ and the other end is coupled to $V_{REG}$. $V_{REG}$ is coupled to ground by the capacitor C and $V_{SW}$ is coupled to ground by the diode D, which is oriented to allow current flow toward $V_{SW}$.

When the feedback facility 202 assets a signal on $V_{FB}$ indicating that $V_{REG}$ is low, the high side logic 300 asserts a low (e.g., binary 0) voltage on $V_{pctl}$, which turns on PMOS transistor 304 allowing current to flow through the inductor L thereby powering the reactive step-down circuit.

When the feedback facility 202 no longer asserts a signal on $V_{FB}$ indicating that $V_{REG}$ is low, the high side logic 300 asserts a high (e.g., binary 1) voltage on $V_{pctl}$, which turns off PMOS transistor 304 and causes low side logic 302 to assert a high (e.g., binary 1) signal on $V_{nctl}$, which turns on NMOS transistor 306. The NMOS transistor 306 then allows current to flow from ground to $V_{SW}$. In this manner, when PMOS transistor 304 is turned on, current flow through inductor L begins to increase exponentially. When PMOS transistor 304 is turned off and NMOS transistor 306 is turned on, the inductor L continues to draw current from ground inasmuch as an inductor L resists changes in current. The low side logic 302 further takes as an input the output of comparator 308. The comparator 308 has a positive input 310 coupled to $V_{SW}$ and a negative input 312 coupled to a low (e.g., binary 0) voltage. Accordingly, when $V_{SW}$ is above the low voltage, it will output a high (e.g., binary 1) voltage at its output. The low side logic 302 may be configuring to transition $V_{nctl}$ to a low (e.g., binary 0) voltage in response to the high voltage on the output of the comparator 308. Accordingly, the NMOS transistor 306 will be turned off when the PMOS transistor is turned on and $V_{SW}$ rises above the low voltage.

FIG. 4 is an example implementation of the high side logic 300. In particular, the high side logic 300 decreases the frequency at which the feedback voltage $V_{FB}$ is evaluated ("the polling frequency") by a comparator 400 when the HP line is not asserted relative to the poling frequency when the HP line is asserted.

Figure 6:
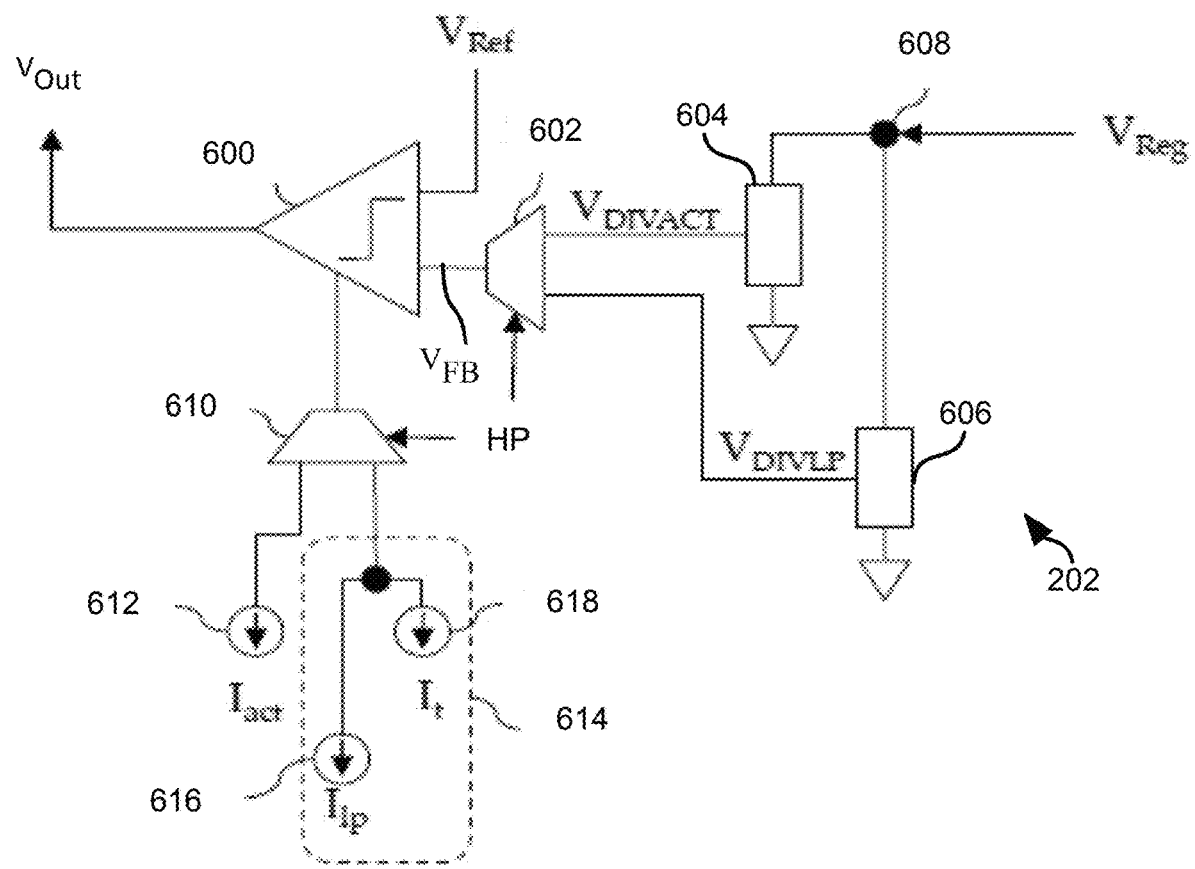
FIG. 6 is a schematic block diagram of a feedback facility for a buck converter in accordance with an embodiment of the present invention.

The comparator 400 has its positive (+) input coupled to $V_{Ref}$ and its negative (−) input coupled to $V_{FB}$, which may be a regulated voltage, such as an attenuated version of a regulated voltage (see FIG. 6). The output ($V_{out}$) of the comparator 400 is coupled to a "start" input of a counter or Ton generator 402. Upon detecting a rising edge on its start input, the Ton generator 402 counts a number of rising edges on its clock (clk) input. From detecting the rising edge on its start input until the number of rising edges counted is equal to a programmed value, e.g. a TON value provided on a length input of the Ton generator 402, the Ton generator 402 causes a transition on its output, which is coupled to $V_{pctl}$ in this case.

In the illustrated embodiment, the output of the Ton generator 402 goes from the high voltage to the low voltage after the rising edge is detected on the start input and stays at the low voltage until the number of counted clock cycles is equal to the length input. The output of the Ton generator 402 may then change to the high voltage. Of course, the above description of the Ton generator 402 is subject to delays in propagating of start and clock signals through the Ton generator 402 and therefore the transitions on the output of the Ton generator 402 may be delayed 1-2 clock cycles relative to what is described above.

As shown in FIG. 4, the comparator 400 also has a clock (clk) input and functions such that a result of the comparison of its positive and negative inputs is latched and held at its output in response to a rising clock edge on its clock input. Example implementations of the comparator 400 and other comparators used herein are described below with respect to FIGS. 10A and 10B.

In the illustrated embodiment, the clock input of the comparator 400 is coupled to an output 408a of a multiplexer 404a. The multiplexor 404a has one input (0) coupled to a low frequency clock (LFclk) and a second input (1) coupled to a high frequency clock (HFclk). The high frequency clock produces pulses at a higher frequency than the low frequency clock, such as between 100 and 1000 times higher. For example, the high frequency clock may be above 1 MHz whereas the low frequency clock is between 1 and 100 kHz.

The selector of the multiplexor 404a is coupled to the HP line. Accordingly, when the HP line indicates operation in the high frequency mode, the high frequency clock is coupled to the output 408a and controls the polling frequency of the comparator 400. Otherwise, the low frequency clock is coupled to the output 408a and controls the polling frequency of the comparator 400. In this manner, the power consumption of the comparator 400 is reduced when not in the high power mode.

In some instances, it may be desirable to keep the pulses of power supplied to the reactive step-down circuit to be at or near the same length in both high and low power mode. Accordingly, the clock input of the Ton generator may be coupled to the output 408b of a multiplexor 404b. The multiplexer 404b takes as one input (0) an output of a ring oscillator 406 and as its other input (1) the high frequency clock (HFclk). The selector of the multiplexor 404b may likewise be coupled to the HP line.

In this manner, the ring oscillator provides a clock signal to the clock input of the Ton generator 402 in the low power mode and the high frequency clock is coupled to the clock input of the Ton generator 402 in the high power mode. The ring oscillator 406 may have a frequency substantially equal to the high frequency clock, e.g. within 10 percent. In this manner, the length of pulses clocked by the ring oscillator 406 will be substantially equal to pulses clocked by the high frequency clock. In instances where a designer wishes the pulses to be unequal, the frequency of the ring oscillator 406 may be larger than or smaller than the frequency of the high frequency clock. Use of a ring oscillator 406 enables a frequency similar in frequency to the high frequency clock to be generated in the low power mode without using the power required to activate the high frequency clock. The high frequency clock (not shown) may therefore be powered down when the HP line is not asserted and powered up when the HP line is asserted.

In some embodiments, the ring oscillator 406 may have an enable (enb) input that is coupled to the output of the comparator 400. Accordingly, the ring oscillator is turned on when the comparator 400 indicates that the Ton generator 402 should generate a pulse. In some embodiments, the ring oscillator may remain on in response to a rising edge on the enable input until a rising edge on the output ($V_{pctl}$) of the Ton generator 402 is detected at a disable (dis) input of the ring oscillator 406. In this manner, the ring oscillator 306 is turned off after the Ton generator 402 has counted out a pulse.

In some embodiments, to further save on power, the enable input of the ring oscillator 406 can only be enabled when the HP line is not asserted, such as by ANDing the inverse of the HP line (!HP) with the output of the comparator 400 and inputting the result of the ANDing to the enable input of the ring oscillator 406.

FIG. 5 illustrates an example of the low side logic 302. In the illustrated embodiment, the low side logic 302 is a D flip flop. The D input is coupled to the high voltage (e.g., binary 1) and the clock input is coupled to $V_{pctl}$. The clear (Clr) input of the D flip flop is coupled to the output of the comparator 308 ($V_{in}$). The positive output (Q) of the D flip flop is coupled to $V_{nctl}$.

Using this configuration, a rising edge on $V_{pctl}$ causes a high voltage (e.g., binary 1) to be latched to the output Q. When the output of the comparator 308 goes to the high voltage on the clear input, the D flip flop is cleared and Q goes to the low voltage (e.g., binary 0). Accordingly, $V_{nctl}$ goes low and the NMOS 306 is turned off. As noted above, the output of the comparator 308 goes high when $V_{SW}$ is greater than the low voltage (e.g., binary 0), which occurs when the PMOS 304 is turned on (see FIG. 3). Accordingly, the low side logic 302 turns off the NMOS 306 when the PMOS is turned on.

FIG. 6 illustrates an example implementation of the feedback facility 202. The feedback facility 202 may be used in combination with the switching facility 200 or may be used to provide feedback to a switch for a buck converter according to any prior approach. In particular, the illustrated feedback facility 202 provides two power saving functions: (1) the impedance of a voltage divider is increased in the low power mode relative to the impedance of the voltage divider in the high power mode and (2) the biasing current supplied to a comparator is decreased in the low power mode relative to the current supplied to the comparator in the high power mode. Either of these approaches may be used alone or they may be used in combination.

In the illustrated embodiment, a comparator 600 takes as its positive input $V_{Ref}$ and as its negative input the output ($V_{FB}$) of a voltage divider. In the illustrated embodiment, the voltage divider includes a multiplexer 602 that selectively couples the output of a voltage divider 604 ($V_{DIVACT}$) or the output of a voltage divider 606 ($V_{DIVLP}$) as $V_{FB}$ to the negative input of the comparator 600. The selector of the multiplexor 602 is coupled to the HP line. Accordingly, when a signal is asserted on the HP line indicating operation in the high power mode, the output of voltage divider 604 is coupled to the negative input of the comparator 600. Otherwise, the output of voltage divider 606 is coupled to the negative input.

The voltage dividers 604, 606 have their inputs coupled to $V_{Reg}$. The voltage dividers 604, 606 operate to scale $V_{Reg}$ to the magnitude $V_{Ref}$. For example, an available reference voltage may be 0.5 Volts whereas a desired stepped down voltage is 3 volts. Accordingly, the voltage dividers 604, 606 scale down $V_{Reg}$ by a factor of 6 such that when $V_{Reg}$ is 3 Volts, the output of the voltage dividers $V_{FB}$ will match $V_{Ref}$=0.5 volts.

In the illustrated embodiment, voltage divider 606 has higher impedance than the voltage divider 604, such as between 100 and 1000 times higher, preferably between 500 and 1500 times higher. Accordingly, voltage divider 606 consumes more power but supplies greater current to the comparator 600, thereby providing a faster response time. The voltage divider 604 consumes less power and supplies less current to the comparator 600, thereby providing a slower response time. For example, the voltage divider 604 may be implemented using resistors whereas the voltage divider 606 is implemented using diodes. The resistors used to implement the voltage divider 604 may be sized to achieve a desired response time when driving the comparator 600. The resistive voltage divider 604 and diode voltage divider 606 may be implemented using any approach for implementing such voltage dividers as known in the art.

The output of multiplexor 602 may be used as the feedback voltage $V_{FB}$ (see FIG. 4) for the switching facility 200 or a switching facility for any other approach for implementing a buck converter as known in the art. For example, the comparator 600 may be embodied as the comparator 400 of FIG. 4 used in combination with the other elements of the high side logic 300 of FIG. 4. Accordingly, the comparator 400 may be considered to be part of the feedback facility 202 rather than part of the switching facility 200.

The feedback facility may also include a multiplexor 610 having one input coupled to current source 612 ($I_{act}$) and another input coupled to a current source 614. The output of the multiplexor 610 may be coupled to a biasing voltage input of the comparator 600. The selector of the multiplexor 610 is coupled to the HP line. When a signal is asserted on the HP line indicating operation in the high power mode, the current source 612 is coupled to the comparator 600 otherwise the current source 614 is coupled to the comparator 600. The current source 612 produces a greater amount of current than the current source 614, such as between 100 and 1000 times, preferably between 500 and 1500, times as much current.

In the illustrated embodiment, the current source 614 includes both a low power current source 616 ($I_{lp}$) and a temperature compensating current source 618 ($I_t$) coupled to the multiplexor 610 in parallel. The temperature compensating current source 618 produces a temperature dependent current that compensates for variation in the current source 618 due to changes in temperature. The current sources 618, 612 may be implemented using any approach for temperature compensating current sources known in the art.

By using a smaller current source in the low power mode, the power consumption and response time of the comparator 600 is reduced. In particular, with smaller biasing current the time required to charge gate capacitances within the comparator 600 increases. As noted above, the comparator 600 may be used to implement the comparator 400 of the high side logic 300 or may be used as part of a switching facility for any design of a buck converter as known in the art.

The output of the comparator 600 ($V_{Out}$) may be used to control a switch, such as the PMOS 304.

Figure 7:
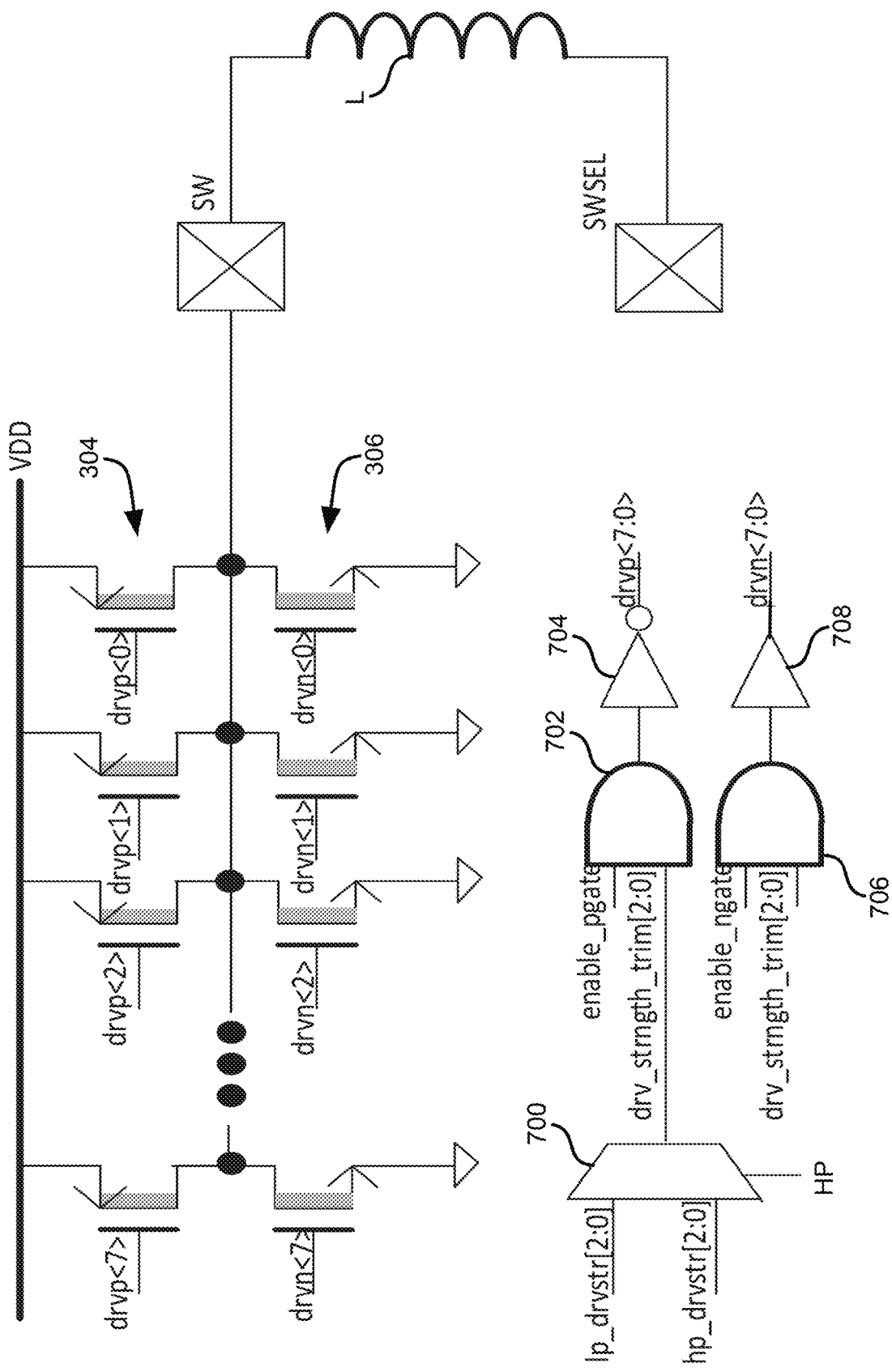
FIG. 7 is a schematic block diagram of switch with adjustable width for a buck converter in accordance with an embodiment of the present invention.

Referring to FIG. 7, in some embodiments, transistors may have variable sizes. In this manner, where faster response time is needed in high power mode, a large effective transistor may be used. Where a slower response time is acceptable in low power mode, a smaller effective transistor may be used. In this manner, resistance is low in high power mode and gate capacitance is low in low power mode.

The NMOS and PMOS devices switching the current going to the inductor of the buck converter can be made programmable. That is, some branches of these transistors can be turned-off even while the transistors are active. In this way, if only a small amount of current needs to be passed through the inductor, the active NMOS and PMOS devices can be reduced, and capacitance that has to be charged or discharged is reduced.

The information about the amount of current passing through the inductor can be either sensed in the buck converter circuit, or inferred from the application being activated. A system can drive the application, and based on the knowledge of how much power is consumed in that application, the system can adjust the size of the inductor switch using the circuit described below.

For example, the PMOS transistor 304 and the NMOS transistor 306 of FIG. 3 may each be embodied as a plurality of transistors 304, 306. A multiplexor 700 may have one input coupled to lp_drvstr[2:0] and another input coupled to hp_drvstr[2:0]. The multiplexor 700 may be a multi-output multiplexor 700 such that each of lp_drvstr[2:0] and hp_drvstr[2:0] includes multiple lines that are coupled to the multiple outputs of the multiplexor when selected. The selector of the multiplexor 700 may be coupled to the HP line such that hp_drvstr[2:0] is coupled to the output of the multiplexor (drv_strngth_trim[2:0]) when a signal is asserted on the HP line indicating operation in the high power mode. Otherwise, lp_drvstr[2:0] is coupled to drv_strngth_trim[2:0].

The lines of the output of the multiplexer 700 (drv_strngth_trim[2:0]) may be input to AND gates 702, 706. In particular, each line of drv_strngth_trim[2:0] may be input to AND gates 702 with an enable_pgate line, which is used when the PMOS transistors 304 are to be turned on (e.g., enable_pgate may be coupled to $V_{pctl}$). Each line of drv_strngth_trim[2:0] may be input to AND gates 706 with an enable_ngate line, which is used when the PMOS transistors 304 are to be turned on (e.g., enable_ngate may be coupled to $V_{nctl}$).

The outputs of the AND gates 702 may be coupled to inverters 704. In the illustrated embodiment, either (a) the output of each AND gate 702 is coupled to multiple buffers 704, or each inverter 704 is coupled to multiple output lines. In particular, the three lines of drv_strngth_trim[2:0] may be coupled to eight lines of drvp<7:0>. For example, drv_strngth_trim[0] may be coupled to drvp<0> through an AND gate 702 and an inverter 704, drv_strngth_trim[1] may be coupled to drvp<1:2> through one or more AND gates and inverters 704, and drv_strngth_trim[2] may be coupled to drvp<3:7> through one or more AND gates and inverters 704. In this manner, each line of drv_strngth_trim becomes a digit in a three-digit binary number that selects the number (0 through 7) of the lines of drvp<7:0> that will be asserted. The controller 102 may control the assertion of signals on the lp_drvstr[2:0] and hp_drvstr[2:0] in order to provide a desired amount of current for a given load. For example, in high power mode, the signals on hp_drvstr[2:0] may be [1,1,1]. In low power mode, the signals on lp_drvstr[2:0] may be [0,0,1]. The controller 102 may tune the values hp_drvstr[2:0] and/or lp_drvstr[2:0] in order to accommodate variations in loading, rather than having only two switch sizes.

The AND gates 706 and buffers 708 operate in an identical manner to the AND gates 702 and buffers 704 to select lines drvn<7:0> according to drv_strength_trim[2:0] when the enable_ngate line is asserted. Note that buffers 708 are used rather than inverters 704 for driving the NMOS transistors 306.

Each line of drvp<7:0> is coupled to the gate of one of the PMOS transistors 304. In a like manner, each line drvn<7:0> is coupled to the gate of one of the NMOS transistors 306.

In the illustrated embodiment there are eight gates 304 and eight gates 306. Any number of transistors 304, 306 may be used. For example, where lp_drvstr and hp_drvstr are four lines wide, there may be 16 transistors 304 and 16 transistors 306.

Outputs of transistors 304 and transistors 306 may all be coupled to an input pad SW of the inductor L. An output pad SWSEL of the inductor L may be coupled to the node $V_{Reg}$.

Figure 8:
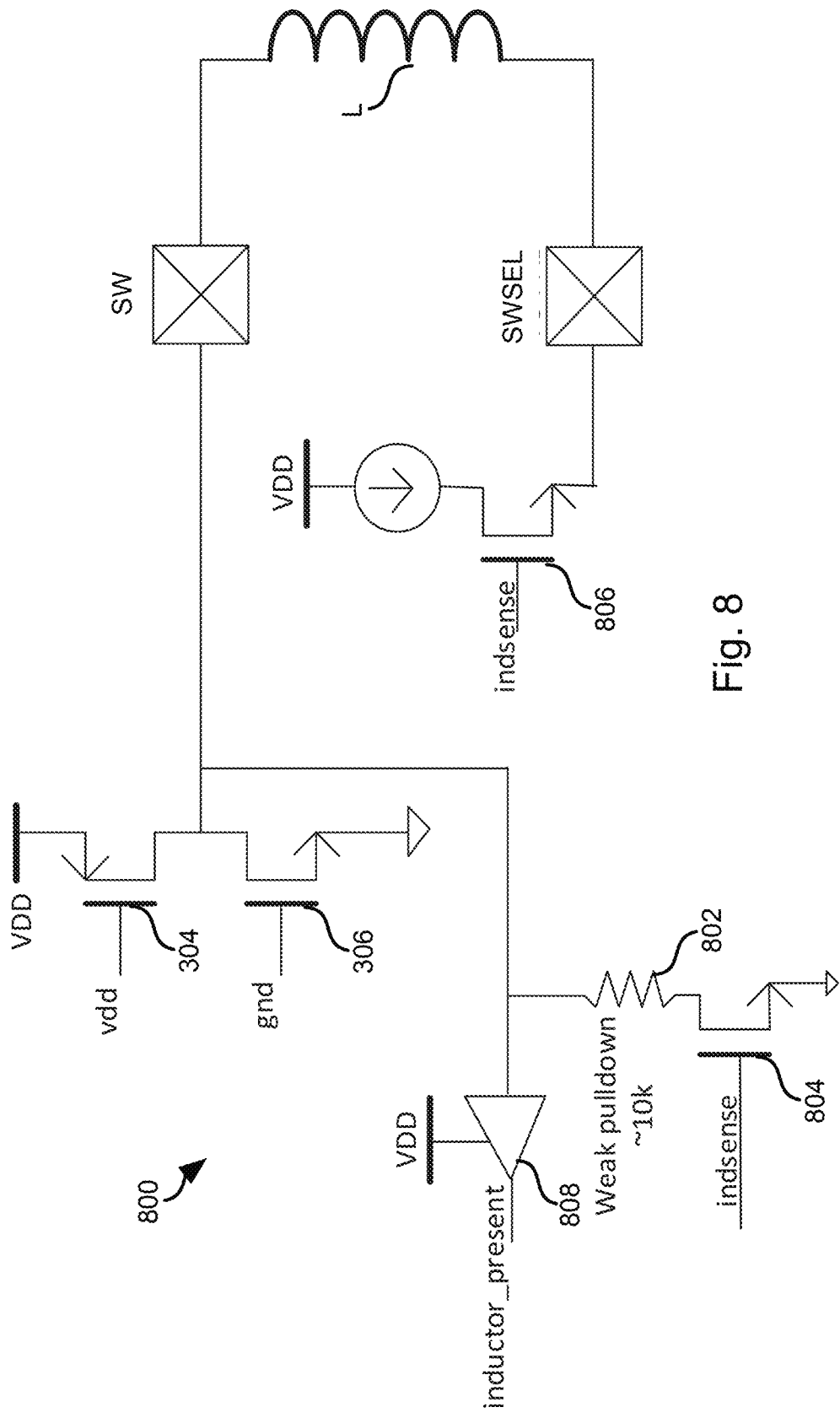
FIG. 8 is a schematic block diagram of a circuit for sensing presence of an inductor in accordance with an embodiment of the present invention.

FIG. 8 illustrates a circuit 800 for sensing the presence of the inductor L. The circuit 800 includes a pull down resistor 802 that draws current through the inductor L in response to an interrogation line "indsense." For example, the controller 102 may generate a signal on indsense, e.g. the high voltage. The resistor 802 typically has a small resistance, such as between 5 and 15 kΩ, for example, 10 kΩ. The resistor 802 may be coupled to ground by a NMOS transistor 804 having its gate coupled to indsense. The other end of the resistor is coupled to the SW pad of the inductor L. The other pad SWSEL of the inductor may be coupled to a drive voltage VDD by an NMOS transistor 806. The gate of the NMOS transistor 806 may also be coupled to the indsense signal such that current is turned on from VDD, through transistor 806, inductor L, resistor 802, and transistor 804 when indsense is at the high voltage.

In some embodiments, PMOS 304 and NMOS 306 are placed by the controller 102 in a high impedance state by coupling their gates to VDD and ground, respectively, when the indsense signal is asserted. In this manner, current through the inductor is constrained to pass through the pull down resistor 802 rather than through either of the transistors 304, 306. The presence of the pull down resistor 802 will cause the voltage at the SW pad to be approximately R*I, where R is the resistance of the pull down resistor and I is the current through the inductor L that also passes through the pulldown resistor 802.

The voltage at SW is input to a buffer 808, the output of which is an "inductor_present" signal. Accordingly, when current passes through the pull down resistor 802, the output ("inductor_present") of the buffer 808 will go high once the voltage is above a transition threshold voltage of the buffer (e.g., ~VDD/2), (e.g., binary 1) otherwise the output of buffer 808 will be low (e.g., binary 0). When the inductor_present signal goes to the high voltage after asserting the indsense signal, the controller 102 may determine that the inductor L is present and operate the reactive step-down circuit as a buck converter. When no inductor is sensed (inductor_present stays at the low voltage while asserting indsense), the controller 102 may operate the reactive step-down circuit as a LDO (low drop out) converter.

Figure 9:
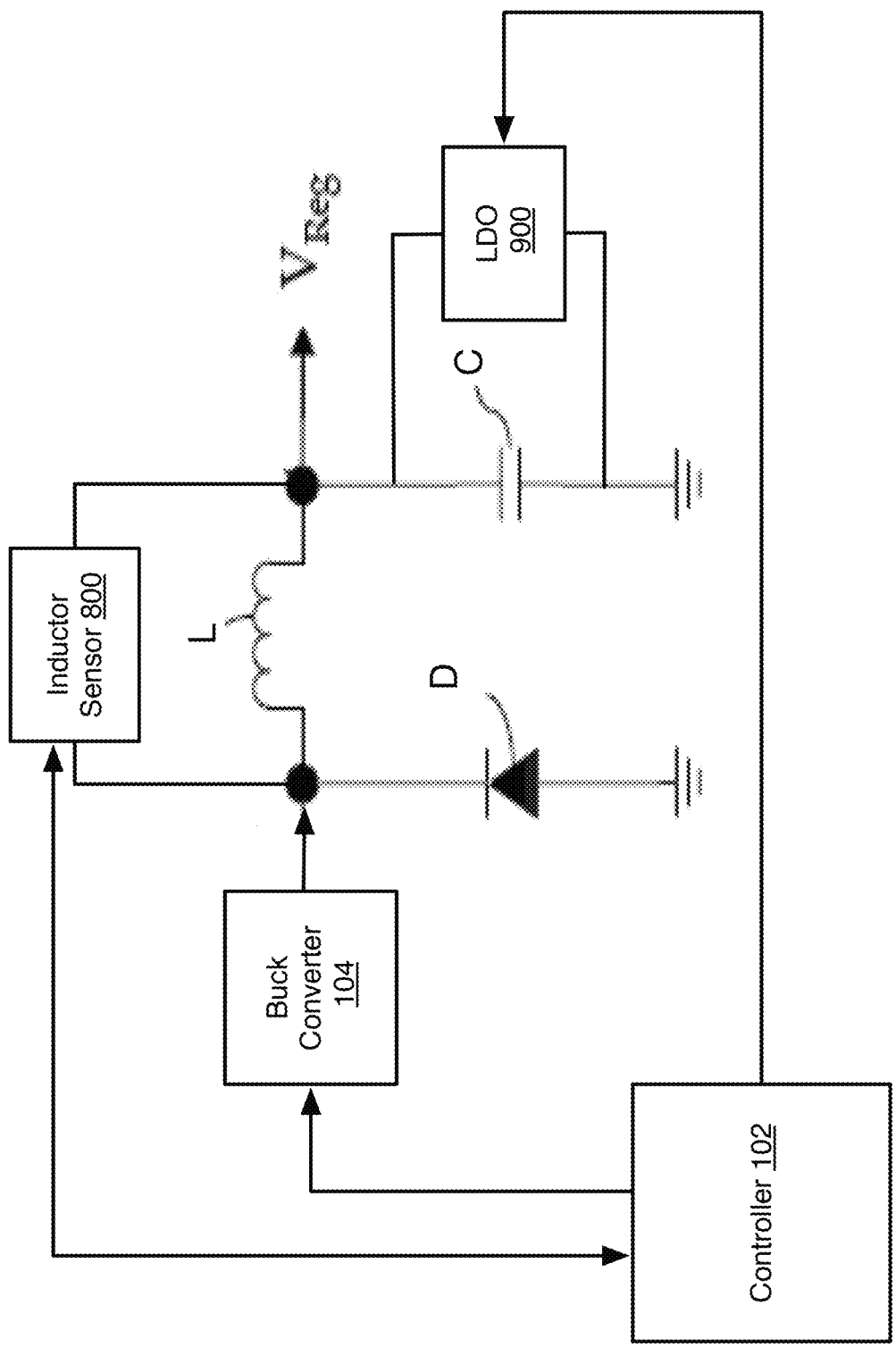
FIG. 9 is a schematic block diagram of a system including the inductor-sensing circuit of FIG. 8.

FIG. 9 illustrates an example architecture incorporating the inductor sensing circuit 800. The controller 102 asserts the indsense signal and may detect an output of the inductor sensing circuit 800 on the inductor_present line. If so, then the controller 102 may enable the buck converter 104, such as by supplying power to components thereof. When the inductor L is determined not to be present, some or all of the inputs ($V_{Ref}$, $V_{REG}$, VDD, ground, may be placed in a high impedance state such that they are isolated. Other points in the buck converter 104 may also be placed in a high impedance state, such as a connection between the reactive step-down circuit and the switching facility and feedback facility. For example, the connection between $V_{SW}$ and the diode D as shown in FIG. 3 may be placed by the controller in a high impedance state.

When an inductor is not sensed, the controller 102 may enable a LDO circuit 900. Accordingly, power and an output ($V_{Reg}$) may be connected to an LDO circuit 900 that uses the capacitor C in order to provide the functionality of an LDO as known in the art.

Figure 10A:
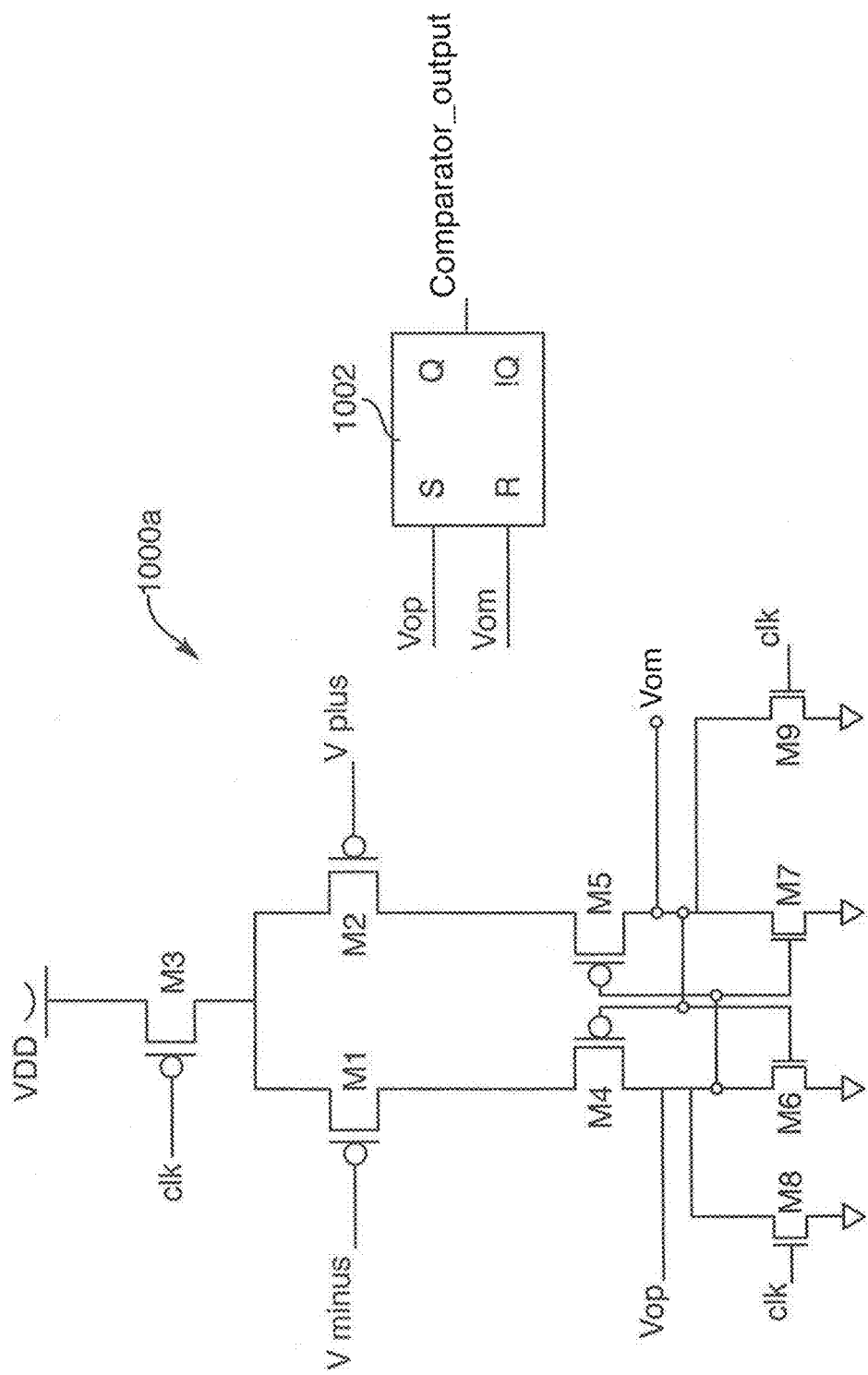
FIG. 10A is a schematic block diagram of a strong arm comparator in accordance with the prior art.

Referring to FIG. 10A, some or all of the comparators 308, 400, 600, 808 may be embodied as the illustrated strong arm comparator 1000a. As shown, a PMOS transistor M3 has its gate coupled to a clock input (Clk). The transistor M3 couples the drive voltage VDD to two PMOS transistors M1 and M2 in parallel. The gate of transistor minus, M1 is coupled to the negative input of the comparator 1000a ($V_{minus}$) and the gate of transistor M2 is coupled to the positive input of the comparator 1000a.

The other side of transistor M1 is coupled to PMOS transistor M4 and the other side of transistor M4 is coupled to ground by an NMOS transistor M6. The output of transistor M2 is coupled to PMOS transistor M5 and the other side of the transistor M5 is coupled to ground by an NMOS transistor M7. The gate of M4 and the gate of M6 are coupled to a node between transistors M5 and M7 that is labeled here as $V_{om}$. Likewise, the gate of M5 and the gate of M7 are coupled to a node between M4 and M6 that is labeled here as $V_{op}$. $V_{op}$ is coupled by NMOS transistor M8 to ground and the gate of M8 is coupled to the clock input. Likewise, $V_{om}$ is coupled by NMOS transistor M9 to ground and the gate of M8 is coupled to the clock input.

Nodes $V_{op}$ and $V_{om}$ are coupled to the set (S) and reset (R) inputs, respectively, of an SR latch 1002. The output Q of the SR latch is the output of the comparator ("comparator_output").

In operation, when the clock input is at the high voltage, M3 is off, M8 and M9 are on and both $V_{om}$ and $V_{op}$ are at the low voltage (e.g., binary 0). This functions as a reset of the SR latch.

When the clock input is at the low voltage, M3 is on, M8 and M9 are off. Current is therefore allowed to flow through M1 and M2 according to the voltages at their gates ($V_{minus}$ and $V_{plus}$). If $V_{plus}$ is greater than $V_{minus}$, then $V_{op}$ goes to the high voltage and $V_{om}$ goes to the low voltage, resulting in the SR latch 1002 being set (Q=binary 1). If $V_{plus}$ is less than $V_{minus}$, $V_{op}$ goes to the low voltage and $V_{om}$ is at the high voltage, resulting in the SR latch being reset (Q=binary 0).

When either of $V_{om}$ or $V_{op}$ are at the high voltage, current flow through the comparator 100a is turned off due to the connection between $V_{om}$ and the gate of transistor M6 and the connection between $V_{op}$ and the gate of transistor M7.

One disadvantage of this prior design is that the accuracy of the comparator depends on the precision of transistors M1, M2, M4, M5, M6, and M7.

Figure 10B:
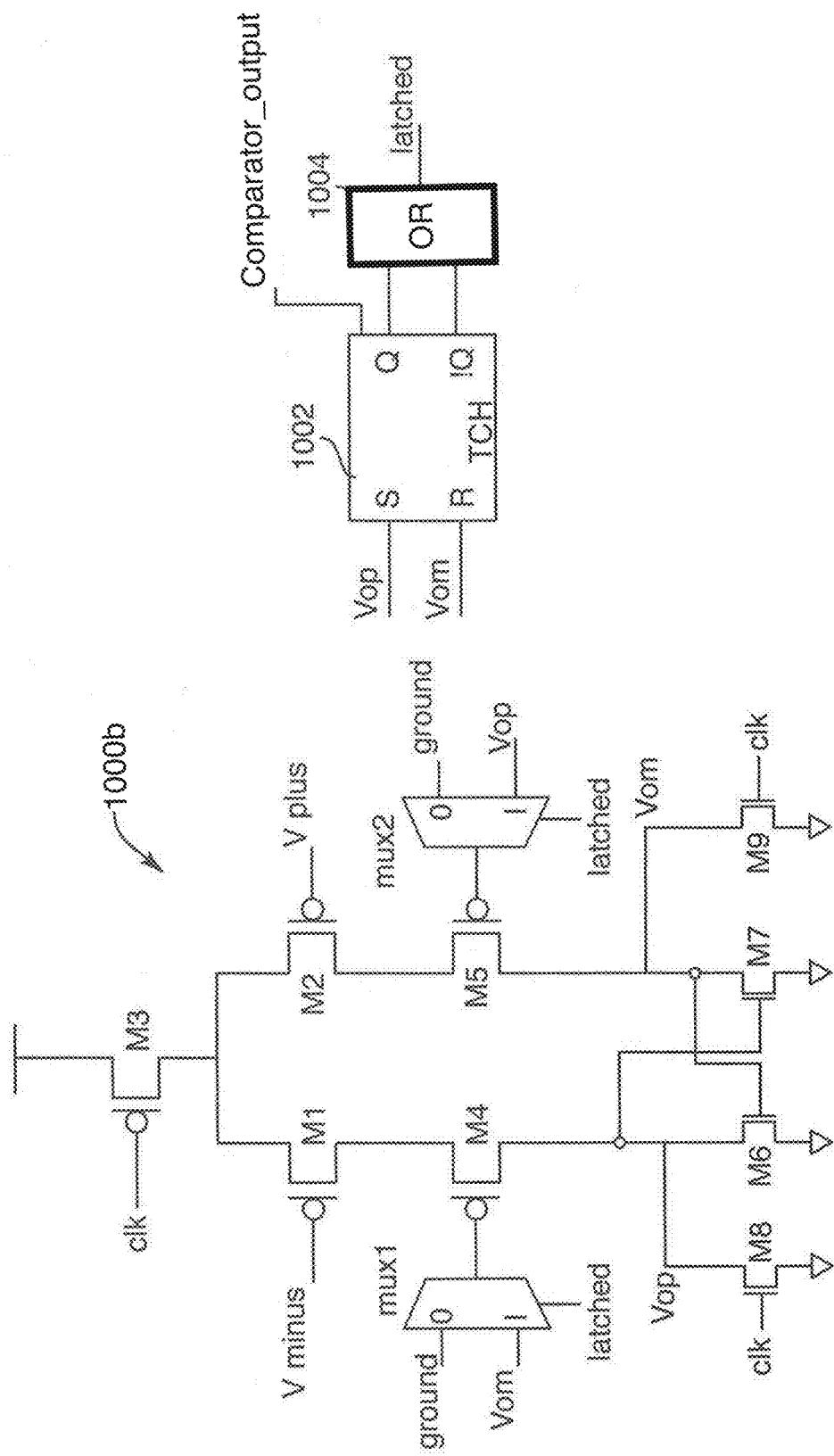
FIG. 10B is a schematic block diagram of a strong arm comparator in accordance with an embodiment of the present invention.

FIG. 10B illustrates an embodiment of an improved design for a strong arm comparator 1000b that is identical to the comparator 1000a except as outlined below. In this alternative approach, $V_{om}$ is coupled to the gate of transistor M4 by a multiplexor MUX1. In particular, one input of the MUX1 is coupled to ground and the other input is coupled to $V_{om}$. The selector of MUX1 is coupled to a line labeled "LATCHED" in the illustrated embodiment and the output of MUX1 is coupled to the gate of the transistor M4.

In a like manner, $V_{op}$ is coupled to the gate of transistor M5 by a multiplexor MUX2. In particular, one input of MUX2 is coupled to ground and the other input is coupled to $V_{op}$. The selector of MUX2 is coupled to LATCHED and the output of MUX2 is coupled to the gate of the transistor M5.

The SR Latch has its outputs Q and !Q (inverse of Q) coupled through an OR gate 1004 to LATCED. Accordingly, when the state of the SR latch settles, one of Q and !Q will be at the high voltage and the latched line will be at the high voltage as well.

When the clock input is high, the comparator 1000b functions in the same manner as the comparator 1000a.

When the clock input is low, transistor M3 is on and transistors M8 and M9 are off. Current is allowed to pass through M1 and M2 according to the voltage on the gates thereof. In particular, if $V_{plus}$ is greater than $V_{minus}$, then $V_{op}$ is at the high voltage and $V_{om}$ is at the low voltage. if $V_{plus}$ is less than $V_{minus}$, $V_{op}$ is at the low voltage and $V_{om}$ is at the high voltage.

When either of $V_{om}$ or $V_{op}$ are at the high voltage, LATCHED will transition to the high voltage and cause the multiplexers MUX1 and MUX2 to select $V_{om}$ and $V_{op}$, respectively. This will turn off transistor M4 and turn on transistor M5 when $V_{om}$ is high. This will turn off transistor M5 and turn on transistor M4 when $V_{op}$ is high. In either case, current through the comparator 1000b is turned off.

The comparator 1000b has the advantage that the accuracy of the comparison between $V_{plus}$ and $V_{minus}$ depends primarily on the accuracy of the transistors M1 and M2 and dependence on the accuracy of M4, M5, M6, and M7 is reduced.

Figure 11:
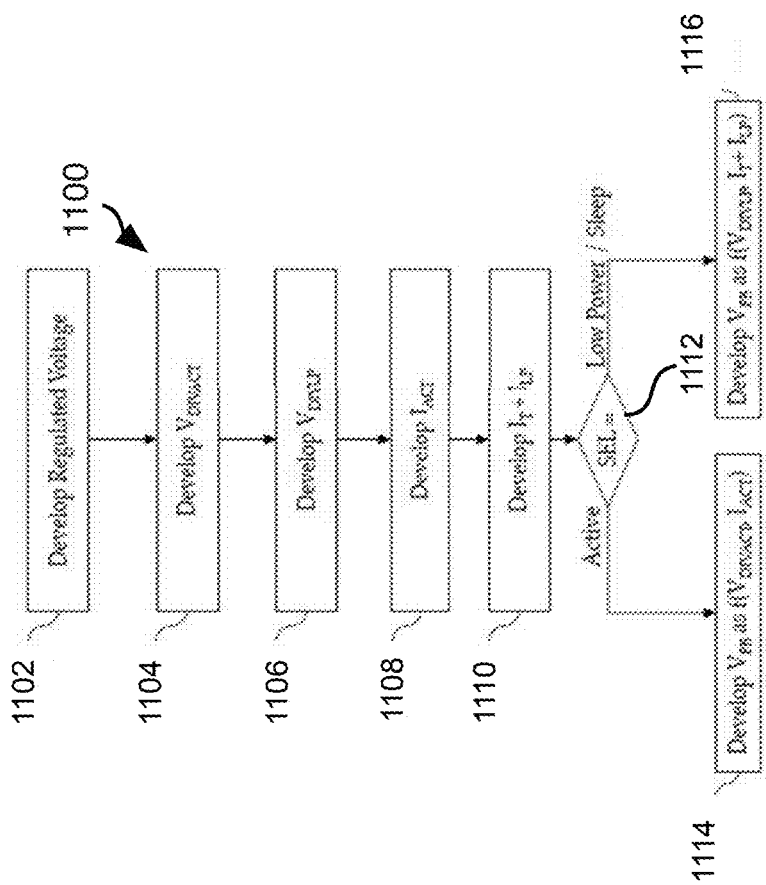
FIG. 11 is a process flow diagram of controlling the biasing voltage and divided voltage for a feedback facility in accordance with an embodiment of the present invention.

FIG. 11 illustrates a method 1100 for operating a feedback facility 202. The method 1100 may include developing 1102 a regulated voltage ($V_{Reg}$) as described above at the output of the inductor L (see FIG. 3). The voltage $V_{Reg}$ is then divided to develop 1104 $V_{DIVACT}$ and develop 1106 $V_{DIVLP}$, as noted above the voltage dividers 604 generating $V_{DIVACT}$ has lower impedance than $V_{DIVLP}$.

The method 1100 may further include developing 1108 a high current $I_{ACT}$ and developing 1110 a lower current that is less than the high current and that may be temperature compensated ($I_T+I_{LP}$). The method 1100 may include evaluating 1112 a state of a selector input (e.g., the HP line) for selecting between $V_{DIVACT}$ and $V_{DIVLP}$ and between $I_{ACT}$ and $I_T+I_{LP}$. If the high power mode is indicated by the selector input, then $V_{FB}$ is developed 1114 as a function of $V_{DIVACT}$ and $I_{ACT}$ as described above with respect to FIG. 6. If the low power mode is indicated by the selector input, then $V_{FB}$ is developed 1116 as a function of $V_{DIVLP}$ and $I_T+I_{LP}$ as described above with respect to FIG. 6.

Figure 12:
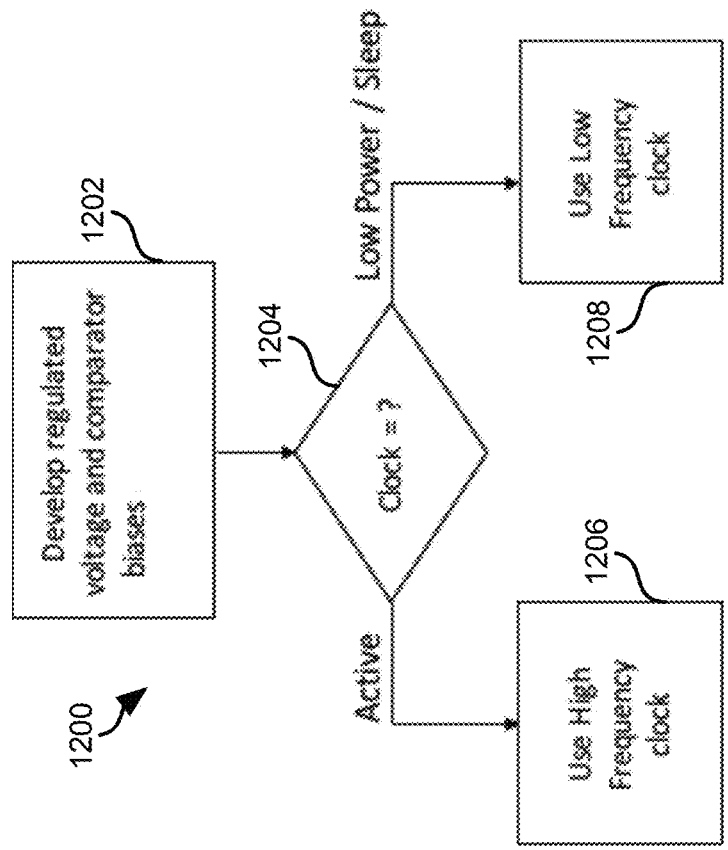
FIG. 12 is a process flow diagram of a method for controlling the frequency of a comparator in accordance with an embodiment of the present invention.

FIG. 12 illustrates a method 1200 for generating clock signals for the switching facility 200, such as the switching facility 200 of FIGS. 3-5. The method 1200 may include developing 1202 voltages and bias current for a comparator, such as using the method 1100. The comparator receiving the voltages and bias current may be either of the comparators 400, 600, described above. Other comparators 308, 808 described herein may also receive the bias current as generated according to the method 1200.

The method 1200 may include evaluating 1204 a state of a clock selector line (e.g., the HP line) for the switching facility 200. If the high power mode is indicated by the selector, then a high frequency clock is used 1206 to poll one or more comparators of the switching facility 200. If the low power mode is indicated by the selector, then a low frequency clock is used 1208 to poll one or more comparators of the switching facility 200.

Figure 13:
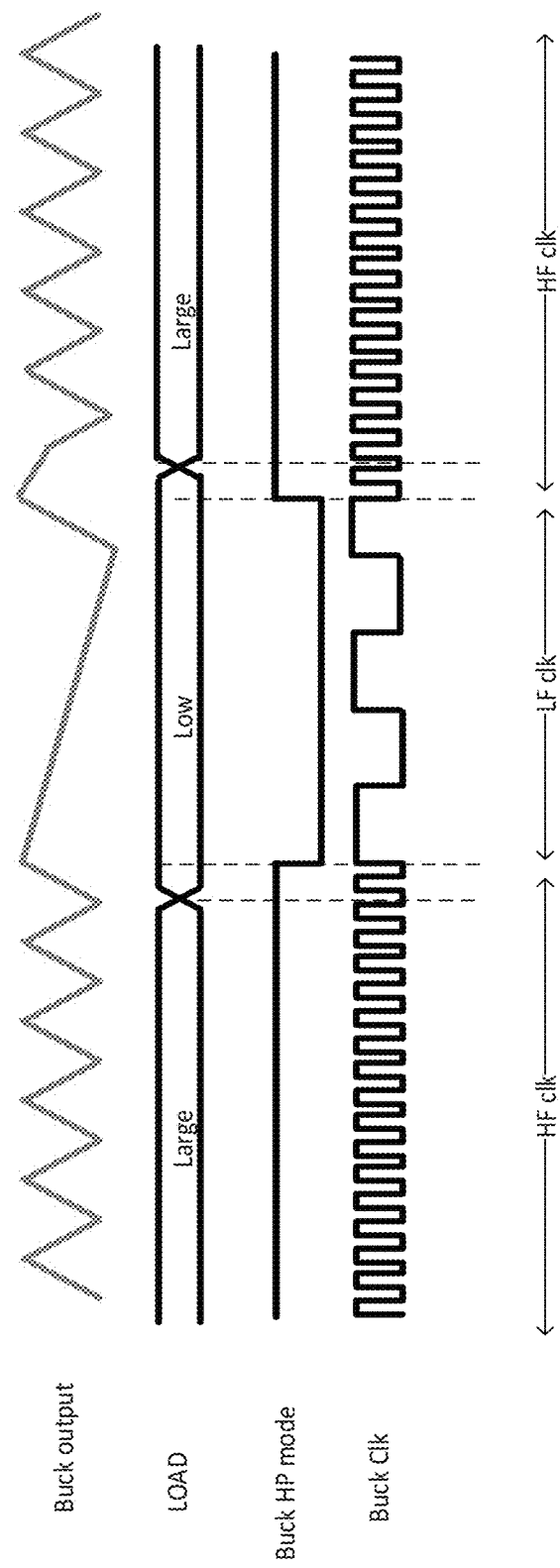
FIG. 13 is an example timing diagram for a buck comparator in accordance with an embodiment of the present invention.

FIG. 13 is a timing diagram demonstrating the operation of a buck converter according to the embodiments disclosed above. The LOAD line indicates the power consumption of a load powered by the buck converter and is shown fluctuating between "LARGE" and "LOW" power consumption.

The line labeled "BUCK HP MODE" illustrates a signal imposed on the HP line and is shown reacting to changes in LOAD with a slight delay e.g., 1-4 clock cycles. In instances where a load is enabled by the same signal as is used to drive the HP line, then this delay may be eliminated in some embodiments. In the illustrated embodiment, the high voltage on the HP line indicates the high power mode and the low voltage indicates the low power mode.

The line labeled "BUCK Clk" illustrates the frequency of the clock used to drive the switching facility, such as the clock used to drive the comparator 400. As is apparent, when the HP line transitions to the low power mode signal, the frequency of BUCK Clk is reduced until the HP line transitions back the high power mode signal. At that point, the clock signal increases to the higher frequency. As shown in FIG. 13, the HP line transitions prior to LOAD increasing, which would be the case where the same signal is used to both enable the load and drive the HP line.

The line labeled "BUCK OUTPUT" represents the output of the buck converter, such as the voltage at $V_{Reg}$. As is apparent, the response of the buck converter in the high power mode is faster in order to accommodate the faster fall time in $V_{Reg}$ due to the current drawn by the higher load. In the low power mode, $V_{Reg}$ falls more slowly due to the decreased current drawn by the low load. The state of $V_{Reg}$ is also evaluated less frequently and pulses of power are generated less frequently in the low power mode.

As is apparent in the foregoing description the buck clock frequency reduces when lower load is applied. As described above, the comparator may adapt to a sleep mode to achieve higher efficiency. Experiments conducted by the inventors have shown that in the active mode a buck converter has an efficiency of 80% or higher, such as when load currents are hundreds of microamps or milliamps. However, efficiency can drop to below 50% at the μA or μA currents seen in sleep mode. One option to deal with this is to switch to a low power LDO, which itself has sub-50% power efficiency.

The circuits described above enable a buck converter to remain active in sleep mode with high efficiency. In addition to the above-described circuits, additional power savings may be achieved by applying power gating circuitry to all components in the buck converter and by introducing a special low power comparator for determining when to dynamically power up the other high current components. In such an approach, when in sleep mode, all components of the buck converter are powered off except for the low power comparator. The low power comparator monitors the buck converter output. When the output drops below the low power comparator's trip voltage and the comparator output flips, the other buck converter components would then be powered up long enough that the buck converter can deliver a single pulse of charge to its output. All circuits except for the comparator would then return to the powered off state. The single pulse of charge may be delivered in low power mode using a local ring oscillator and a counter as described above with respect to FIG. 4. This enables a good control of the pulse width, and minimizes power as the ring oscillator is only turned on when needed.

Figure 14:
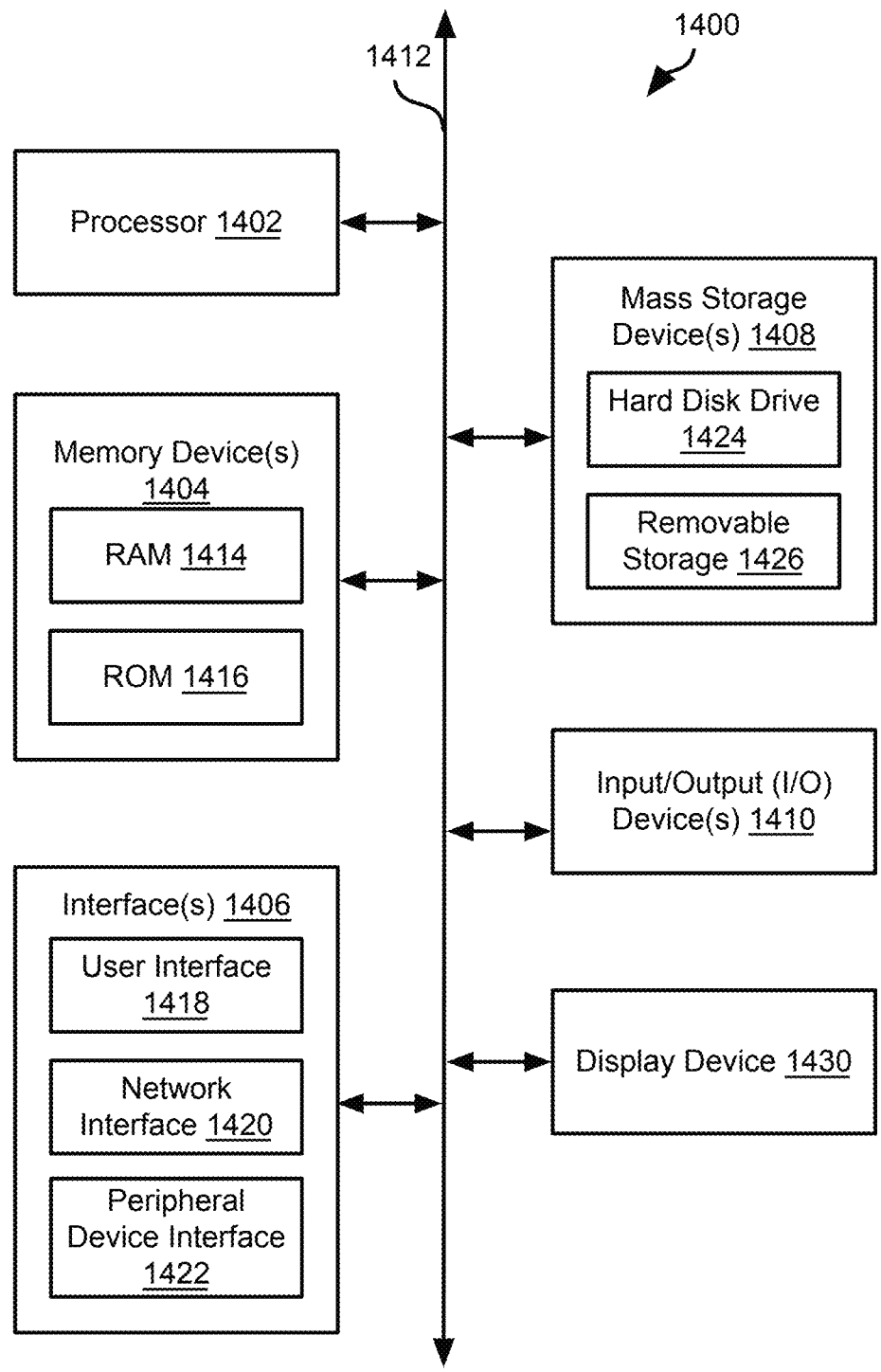
FIG. 14 is a schematic block diagram of an example computing device suitable for incorporating a buck converter in accordance with embodiments of the invention.

FIG. 14 is a block diagram illustrating an example computing device 1400. Computing device 1400 may be used to perform various procedures, such as those discussed herein. One or more computing devices 1400 may be used to implement the server system 102 and be programmed to execute the methods disclosed herein.

Computing device 1400 includes one or more processor(s) 1402, one or more memory device(s) 1404, one or more interface(s) 1406, one or more mass storage device(s) 1408, one or more input/output (I/O) device(s) 1410, and a display device 1430 all of which are coupled to a bus 1412. Processor(s) 1402 include one or more processors or controllers that execute instructions stored in memory device(s) 1404 and/or mass storage device(s) 1408. Processor(s) 1402 may also include various types of computer-readable media, such as cache memory.

Memory device(s) 1404 include various computer-readable media, such as volatile memory (e.g., random access memory (RAM) 1414) and/or nonvolatile memory (e.g., read-only memory (ROM) 1416). Memory device(s) 1404 may also include rewritable ROM, such as Flash memory.

Mass storage device(s) 1408 include various computer readable media, such as magnetic tapes, magnetic disks, optical disks, solid-state memory (e.g., Flash memory), and so forth. As shown in FIG. 14, a particular mass storage device is a hard disk drive 1424. Various drives may also be included in mass storage device(s) 1408 to enable reading from and/or writing to the various computer readable media. Mass storage device(s) 1408 include removable media 1426 and/or non-removable media.

I/O device(s) 1410 include various devices that allow data and/or other information to be input to or retrieved from computing device 1400. Example I/O device(s) 1410 include cursor control devices, keyboards, keypads, microphones, monitors or other display devices, speakers, printers, network interface cards, modems, lenses, CCDs or other image capture devices, and the like.

Display device 1430 includes any type of device capable of displaying information to one or more users of computing device 1400. Examples of display device 1430 include a monitor, display terminal, video projection device, and the like.

Interface(s) 1406 include various interfaces that allow computing device 1400 to interact with other systems, devices, or computing environments. Example interface(s) 1406 include any number of different network interfaces 1420, such as interfaces to local area networks (LANs), wide area networks (WANs), wireless networks, and the Internet. Other interface(s) include user interface 1418 and peripheral device interface 1422. The interface(s) 1406 may also include one or more peripheral interfaces such as interfaces for printers, pointing devices (mice, track pad, etc.), keyboards, and the like.

Bus 1412 allows processor(s) 1402, memory device(s) 1404, interface(s) 1406, mass storage device(s) 1408, I/O device(s) 1410, and display device 1430 to communicate with one another, as well as other devices or components coupled to bus 1412. Bus 1412 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 1400, and are executed by processor(s) 1402. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

In the above disclosure, reference has been made to the accompanying drawings, which form a part hereof, and in which is shown by way of illustration specific implementations in which the disclosure may be practiced. It is understood that other implementations may be utilized and structural changes may be made without departing from the scope of the present disclosure. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Implementations of the systems, devices, and methods disclosed herein may comprise or utilize a special purpose or general-purpose computer including computer hardware, such as, for example, one or more processors and system memory, as discussed herein. Implementations within the scope of the present disclosure may also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (devices). Computer-readable media that carry computer-executable instructions are transmission media. Thus, by way of example, and not limitation, implementations of the disclosure can comprise at least two distinctly different kinds of computer-readable media: computer storage media (devices) and transmission media.

Computer storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

An implementation of the devices, systems, and methods disclosed herein may communicate over a computer network. A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links, which can be used to carry desired program code means in the form of computer-executable instructions or data structures and which can be accessed by a general purpose or special purpose computer. Combinations of the above should also be included within the scope of computer-readable media.

Computer-executable instructions comprise, for example, instructions and data which, when executed at a processor, cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the disclosure may be practiced in network computing environments with many types of computer system configurations, including, an in-dash vehicle computer, personal computers, desktop computers, laptop computers, message processors, handheld devices, multi-processor systems, microprocessor-based or programmable consumer electronics, network PCs, minicomputers, mainframe computers, mobile telephones, PDAs, tablets, pagers, routers, switches, various storage devices, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Further, where appropriate, functions described herein can be performed in one or more of: hardware, software, firmware, digital components, or analog components. For example, one or more application specific integrated circuits (ASICs) can be programmed to carry out one or more of the systems and procedures described herein. Certain terms are used throughout the description and claims to refer to particular system components. As one skilled in the art will appreciate, components may be referred to by different names. This document does not intend to distinguish between components that differ in name, but not function.

It should be noted that the sensor embodiments discussed above may comprise computer hardware, software, firmware, or any combination thereof to perform at least a portion of their functions. For example, a sensor may include computer code configured to be executed in one or more processors, and may include hardware logic/electrical circuitry controlled by the computer code. These example devices are provided herein purposes of illustration, and are not intended to be limiting. Embodiments of the present disclosure may be implemented in further types of devices, as would be known to persons skilled in the relevant art(s).

At least some embodiments of the disclosure have been directed to computer program products comprising such logic (e.g., in the form of software) stored on any computer useable medium. Such software, when executed in one or more data processing devices, causes a device to operate as described herein.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments, but should be defined only in accordance with the following claims and their equivalents. The foregoing description has been presented for the purposes of illustration and description. It is not intended to be exhaustive or to limit the disclosure to the precise form disclosed. Many modifications and variations are possible in light of the above teaching. Further, it should be noted that any or all of the aforementioned alternate implementations may be used in any combination desired to form additional hybrid implementations of the disclosure.

The invention claimed is:

1. An apparatus comprising:
   a reactive step-down circuit; and
   a drive circuit coupled to the reactive step-down circuit and having a high power line and a comparator;
   wherein the drive circuit is configured to:
   receive a regulated voltage from the reactive step-down circuit and supply power to the reactive step-down circuit according to the regulated voltage;
   evaluate, at a high frequency, the regulated voltage using the comparator in response to assertion of a signal on the high power line; and
   evaluate, at a low frequency, the regulated voltage using the comparator when the signal is not asserted on the high power line, the low frequency being lower than the high frequency.

2. The apparatus of claim 1, wherein the reactive step-down circuit operates as a buck converter.

3. The apparatus of claim 1, wherein the drive circuit further comprises:
   a feedback circuit configured to generate a feedback signal on a feedback output according to an evaluation of the regulated voltage with respect to a reference voltage, the feedback circuit having a component configured to operate at at least one of a lower voltage and a lower current in the sleep mode than in the active mode.

4. A method comprising:
   providing a reactive step-down circuit;
   providing a switching circuit configured to evaluate a regulated voltage from the reactive step-down circuit and supply an input to the reactive step-down circuit according to evaluations of the regulated voltage;
   performing, by the switching circuit, the evaluations of the regulated voltage at a high frequency when in an active mode; and
   performing, by the switching circuit, the evaluations of the regulated voltage at a low frequency in a sleep mode, the low frequency being less than one hundredth of the high frequency.

5. The method of claim 4, wherein the reactive step-down circuit operates as a buck converter.

6. The method of claim 1, wherein the signal is a voltage corresponding to a binary 1.

* * * * *